United States Patent
Blair et al.

(10) Patent No.: US 11,075,210 B2
(45) Date of Patent: *Jul. 27, 2021

(54) METHOD FOR FABRICATING A CIRCULAR PRINTED MEMORY DEVICE WITH ROTATIONAL DETECTION

(71) Applicant: Xerox Corporation, Norwalk, CT (US)

(72) Inventors: Christopher David Blair, Webster, NY (US); Markus R. Silvestri, Fairport, NY (US)

(73) Assignee: Xerox Corporation, Norwalk, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/551,145

(22) Filed: Aug. 26, 2019

(65) Prior Publication Data

US 2019/0378847 A1 Dec. 12, 2019

Related U.S. Application Data

(63) Continuation of application No. 15/450,856, filed on Mar. 6, 2017, now Pat. No. 10,396,085.

(51) Int. Cl.

| H01L 27/11507 | (2017.01) |
| --- | --- |
| G11C 11/22 | (2006.01) |
| G11C 29/12 | (2006.01) |
| H01L 21/66 | (2006.01) |
| G06K 19/067 | (2006.01) |
| G11B 9/02 | (2006.01) |
| G11C 5/02 | (2006.01) |

(Continued)

(52) U.S. Cl.
CPC ...... *H01L 27/11507* (2013.01); *G06K 19/067* (2013.01); *G11B 9/02* (2013.01); *G11C 5/02* (2013.01); *G11C 5/04* (2013.01); *G11C 11/221* (2013.01); *G11C 11/2273* (2013.01); *G11C 29/12* (2013.01); *H01L 22/14* (2013.01); *G11B 9/1454* (2013.01); *G11C 2029/0403* (2013.01)

(58) Field of Classification Search
CPC ............... H01L 22/14; H01L 27/11502; H01L 27/11507; G11C 11/221; G11C 11/2273; G11C 5/02; G11C 5/04; G11C 29/12; G11C 2029/0403
See application file for complete search history.

(56) References Cited

U.S. PATENT DOCUMENTS

| 9,460,770 B1 | 10/2016 | Nicholes et al. |
| 9,830,969 B2 * | 11/2017 | Slesazeck ............. G11C 11/223 |

(Continued)

FOREIGN PATENT DOCUMENTS

| EP | 1770778 A1 | 4/2007 |
| EP | 1894203 A1 | 3/2008 |

OTHER PUBLICATIONS

Extended European Search Report & Opinion for EP Application No. 18157975.6, dated Jul. 26, 2018, pp. 1-6.

*Primary Examiner* — Andrew Q Tran

(57) ABSTRACT

A circular printed memory device and a method for fabricating the circular printed memory device are disclosed. For example, the circular printed memory device includes a base substrate, a plurality of bottom electrodes arranged in a circular pattern on the base substrate, a ferroelectric layer on top of the plurality of bottom electrodes and a single top electrode on the ferroelectric layer that contacts each one of the plurality of bottom electrodes via the ferroelectric layer.

14 Claims, 5 Drawing Sheets

(51) Int. Cl.
  *G11C 5/04* (2006.01)
  *G11C 29/04* (2006.01)
  *G11B 9/14* (2006.01)

(56) References Cited

U.S. PATENT DOCUMENTS

| | | | |
|---|---|---|---|
| 9,887,205 B2 * | 2/2018 | Fox | H01L 27/11507 |
| 10,396,085 B2 * | 8/2019 | Blair | G11C 11/2273 |
| 2009/0161405 A1 | 6/2009 | Deguet et al. | |
| 2015/0060969 A1 | 3/2015 | Matsuura | |

* cited by examiner

METHOD FOR FABRICATING A CIRCULAR PRINTED MEMORY DEVICE WITH ROTATIONAL DETECTION

This application is a continuation of U.S. patent application Ser. No. 15/450,856, filed Mar. 6, 2017, now U.S. Pat. No. 10,396,085, which is herein incorporated by reference in its entirety.

The present disclosure relates generally to printed memory devices and, more particularly, to circular printed memory devices with rotational detection and methods for creating the same.

BACKGROUND

Printed memory devices may store a bit of information through the state of an active layer sandwiched between two crossing conductor lines or electrodes. The printed memory devices may be used for a variety of different applications. For example, the printed memory devices may store a combination of bits that can be used for identification or other applications.

Currently, the electrodes of printed memory devices are printed in a linear pattern along straight lines. With certain linear patterns if the contact to the electrode fails, then the entire line of associated cells that store the bits may fail. Printed memory devices also use sets of linear electrodes that cross each other forming a matrix of intersecting points. The memory device with the electrodes of intersecting points may have a lower tolerance for misalignment when electrical contact is made. Thus, if the electrical contact of an electrode is misaligned with an electrical pin of a device that reads the output of the printed memory device, an error may occur.

SUMMARY

According to aspects illustrated herein, there are provided a circular printed memory device and a method for fabricated the circular printed memory device. One disclosed feature of the embodiments is a circular printed memory device that comprises a base substrate, a plurality of bottom electrodes arranged in a circular pattern on the base substrate, a ferroelectric layer on top of the plurality of bottom electrodes and a single top electrode on the ferroelectric layer that contacts each one of the plurality of bottom electrodes via the ferroelectric layer.

Another disclosed feature of the embodiments is a method for fabricating the circular printed memory device. In one embodiment, the method comprises providing a base substrate, applying a plurality of bottom electrodes in a circular pattern on the base substrate, applying a circular ferroelectric layer on top of the plurality of bottom electrodes and applying a single top electrode on top of the ferroelectric layer, wherein the single top electrode contacts each one of the plurality of bottom electrodes via the ferroelectric layer.

BRIEF DESCRIPTION OF THE DRAWINGS

The teaching of the present disclosure can be readily understood by considering the following detailed description in conjunction with the accompanying drawings, in which.

To facilitate understanding, identical reference numerals have been used, where possible, to designate identical elements that are common to the figures.

DETAILED DESCRIPTION

The present disclosure broadly discloses circular printed memory devices with rotational detection and method for creating the same. As discussed above, currently used printed memory devices are printed with linear electrodes crisscrossing with an active layer between them. If one contact to an electrode fails, then the entire line of cells on that electrode may fail. The printed memory device with the linear electrodes may have a lower tolerance for misalignment when printed. Thus, if an electrical contact is misaligned with an electrical pin of a device that reads the output of the printed memory device, an error may occur.

Embodiments of the present disclosure provide a circular printed memory device. The circular pattern may use circular electrical contacts that provide a higher amount of contact area than the linear pattern printed memory device as a ratio to the area of the entire device is increased. As a result more latitude for misalignment of the electrical pin of a reading device to the contact point may be provided.

Figure 1:
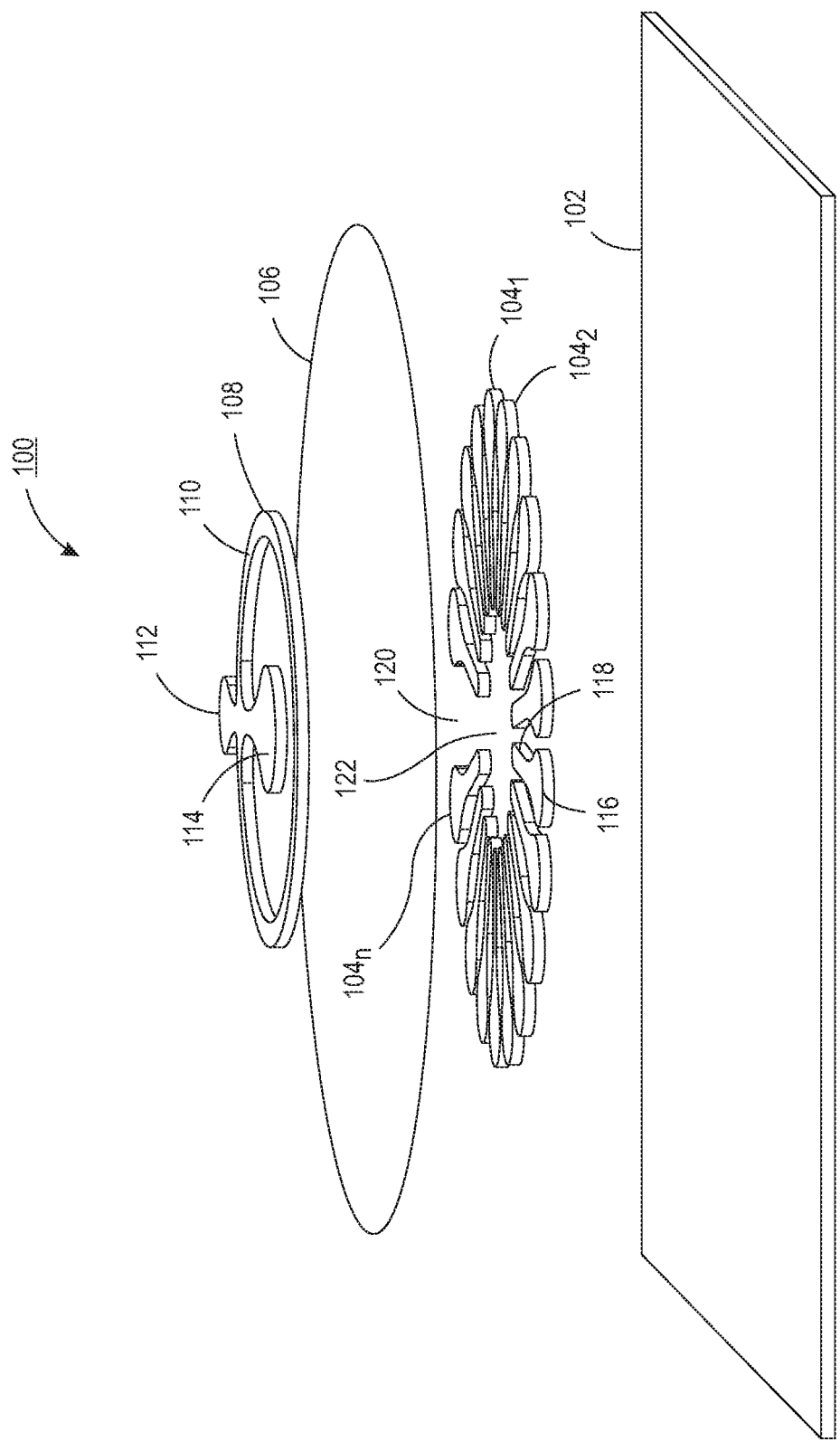
FIG. 1 illustrates an exploded view of an example circular printed memory device.

FIG. 1 illustrates an exploded view of an example of a circular printed memory device 100. The circular printed memory device 100 may include a base substrate 102, a plurality of bottom electrodes $104_1$-$104_n$ (hereinafter also referred to individually as a bottom electrode 104 or collectively as bottom electrodes 104), a ferroelectric layer 106 and a single top electrode 108. In one embodiment, the base substrate 102, the bottom electrodes 104, the ferroelectric layer 106 and the single top electrode 108 may be layered on top of one another.

In one embodiment, the base substrate 102 may be a flexible material. For example, the flexible material may be a flexible plastic. Example flexible plastics may include polyethylene naphthalate (PEN), polyethylene terephthalate (PET), and the like.

In one embodiment, the base substrate 102 may be provided as a continuous sheet. For example, the base substrate 102 may be rolled and fed through an assembly line that produces a plurality of circular printed memory devices 100. Each circular printed memory device 100 may then be stamped or cut out of the continuous sheet of the base substrate 102.

In one embodiment, the plurality of bottom electrodes 104 and the single top electrode 108 may be fabricated from a conductive material. Example conductive materials may include copper, gold, silver, aluminum, and the like.

In one embodiment, each bottom electrode 104 may have a circular contact area 116 and an extended member 118. The circular contact area 116 and the extended member 118 may be a single continuous piece of the conductive material. The overall shape of each bottom electrode 104 may be a paddle with a handle.

The bottom electrodes 104 may be arranged in a circular pattern on the base substrate 102. The bottom electrodes 104 may be arranged in the circular pattern with the circular contact area 116 on the outer perimeter and the extended member 118 pointing towards a center of the circular pattern. The circular pattern may form a center opening 122 in the center of the circular pattern of bottom electrodes 104. In addition, the circular pattern of bottom electrodes 104 may leave a single open position 120 between two of the plurality of bottom electrodes 104. The size of the single open position 120 may be large enough to fit another bottom electrode 104 between two of the bottom electrodes 104 arranged in the circular pattern.

In one embodiment, the number of bottom electrodes 104 may be a function of a number of bits that will be stored in the circular printed memory device. In one example, for a 20 bit circular printed memory device with rotational detection, 20 bottom electrodes 104 may be laid on top of the base substrate 102. However, it should be noted that any number (e.g., more or less than 20) of bottom electrodes 104 may be added depending on a desired number of bits.

In one embodiment, the ferroelectric layer 106 may provide a material that can be polarized with the application of a voltage or electric field. In other words, the polarization state of the ferroelectric layer 106 can be set or switched by applying appropriate voltages to the bottom electrodes 104 and the single top electrode 108. The bottom electrodes 104 intersecting the ferroelectric layer 106 and the single top electrode 108 may form the individual memory cells that store the bits for the circular printed memory device 100. Any type of ferroelectric material may be used for the ferroelectric layer 106. In one embodiment, the ferroelectric layer 106 may comprise a polymer containing fluorine such as polytetrafluoroethylene (PTFE), perfluoroalkoxy (PFA), polyvinylidene fluoride (PVDF), trifluoroethylene (TFE), and the like, or combinations thereof.

In one embodiment, the single top electrode 108 may be in the shape of a ring 110. The ring 110 may include a perimeter member 112 and a center member 114. The perimeter member 112 may have a shape that is substantially similar to the bottom electrodes 104. For example, the perimeter member 112 may also have a circular contact area and an extended member. The perimeter member 112 may be aligned with the center member 114 or may be offset from the center member 114.

In one embodiment, the ring 110, the perimeter member 112 and the center member 114 may be fabricated from a single continuous piece of the conductive material. As a result, the perimeter member 112 may have a very low resistance (e.g., approximately zero resistance) conductive path to the center member 114. For example, if the conductive material is a metal than the perimeter member 112 may have an approximately zero resistance to the center member 114.

Thus, when the circular printed memory device 100 is being read by a reading device that has pins that contact the center member 114 and the perimeter member 112, the reading device may read low impedance (e.g., due to the approximately zero resistance). The low impedance may infer that a pin of the reading device on the center member 114 and another pin of the reading device on the perimeter member 112 are directly connected, and, as a result, identify the pin on the perimeter member 112 as pin 0. In other words, the perimeter member 112 may be an identifying contact that can be read no matter how the circular printed memory device 100 is oriented or rotated. As a result, the circular printed memory device 100 does not have to be manipulated or rotated to have the bits of the printed memory device 100 properly read by a reading device. The reading device may automatically detect the perimeter member 112 by the low impedance (e.g., due to the approximately zero resistance) and know the order of the remaining pins of the bottom electrodes $104_1$-$104_n$.

In one embodiment, the single top electrode 108 may be applied on top of the ferroelectric layer 106. The single top electrode 108 may be positioned such that the center member 114 is located approximately in the center of the center opening 122 and the perimeter member 112 is located in the single open position 120. The perimeter member 112 may be positioned to appear as it is aligned along the circumference of the circular pattern and spaced the same as each one of the bottom electrodes 104. In other words, from a top down view (shown in FIG. 2), the perimeter member 112 would appear to be another bottom electrode 104 within the circular pattern.

In addition, the single top electrode 108 may be positioned such that the ring 110 contacts, via the ferroelectric layer 106, the extended member 118 of each one of the bottom electrodes 104. Thus, the diameter of the ring 110 may be sized such that the ring 110 contacts, via the ferroelectric layer 106, the extended member 118 of each one of the bottom electrodes, but does not overlap any part of the circular contact area 116.

As discussed above, the circular contact areas 116 of the bottom electrodes 104 consume, as a whole, less space. Therefore, the design allows for a tighter form factor (e.g., allows the circular printed memory device 100 to pack more memory cells, and ultimately bits, into a smaller area than rectangular or linearly arranged electrodes of a previous printed memory device designs).

In addition, the circular arrangement of the bottom electrodes 104 helps to reduce the number of bit errors if one contact is misaligned. For example, in a rectangular or a matrix of linear electrodes one contact error can lead to multiple faults for all the cells on the linear electrode where the contact failed. The bit errors associated with the cell faults cannot be corrected using error correction algorithms because it is too costly. For instance, a 4 by 3 matrix of linear electrodes yields 12 cells that can store 12 bits. Some error correction code requires 4 check bits for a 12-bit code word. If a contact to an electrode that is connected to 3 cells fail, all these cells may fail as well. As a result, 3 bits may be faulty. To correct 3 bits 12 check bits are required leaving no bits to store information. In contrast, one contact error of the circularly arranged bottom electrodes 104 can lead only 1-bit error instead of multiple errors reducing the cost of error correction for single contact faults.

Figure 2:
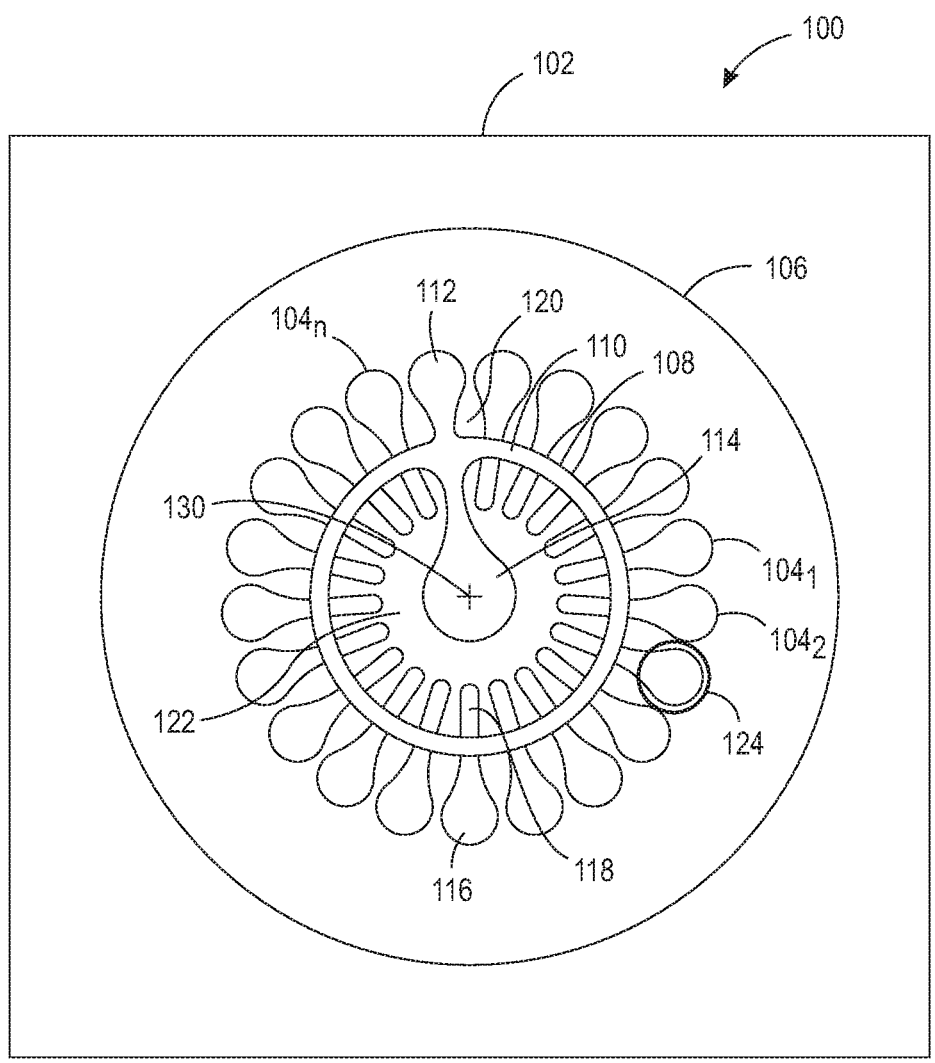
FIG. 2 illustrates a top view of the example circular printed memory device.

FIG. 2 illustrates a top view of the circular printed memory device 100. FIG. 2 illustrates the circular pattern of the bottom electrodes 104 and the perimeter member 112 in the single open position 120, as discussed above. FIG. 2 illustrates the ring 108 in contact, via the ferroelectric layer 106, with the extended member 118 of each one of the bottom electrodes 104. In addition, FIG. 2 illustrates the center member 114 in the center opening 122.

In one embodiment, the center member 114 may provide an alignment mark 130. The alignment mark 130 may be used by a reading device to align the pins of the reading device or machine to the bottom electrodes 104 and the perimeter member 112.

In one embodiment, an additional conducting contact layer 124 may be applied to only the circular contact area 116 of each one of the bottom electrodes 104 and the perimeter member 112. The additional conducting contact layer 124 may comprise carbon or a metal. The additional conducting contact layer 124 may provide protection against abrasion from the pins that may occur through making repeated contact with a reading device.

In one embodiment the ferroelectric layer 106 may cover the bottom electrodes 104. To reestablish means to contact the bottom electrodes 104 the ferroelectric layer 106 may be removed locally, e.g., over the circular contact area 116 of each one of the bottom electrodes 104, by physical and/or chemical means such as etching, dissolving, doping, and the like.

In one embodiment, a protective layer may be applied over the entire circular printed memory device 100 except for the perimeter member 112, the center member 114 and the circular contact area 116 of each one of the bottom electrodes 104 to protect the memory cells (e.g., the ferroelectric layer 106 between the single top electrode 110 and extended member 118 of each one of the bottom electrodes 104) and the single top electrode 110 that is exposed from physical contact with the outside world. The completed circular printed memory device 100 may be initialized or "broken-in" by polarizing the ferroelectric layer 106 multiple times. After initialization, the circular printed memory device 100 may be tested via a write/read bit patterns. The circular contact area 116 of the bottom electrodes 104 arranged in a circular pattern and the center member 114 may increase the overall contact area and maximize the form factor. The center member 114 that has a relatively large area and the circular symmetry of the circular printed memory device 100 improves ease of making contact to all of the bottom electrodes 104 and the single top electrode 108 and significantly reduces the chances of misalignment. After initialization and testing, the completed circular printed memory device 100 may be cut or stamped out of the continuous sheet of the base substrate 102 and used for a variety of different applications.

Figure 3:
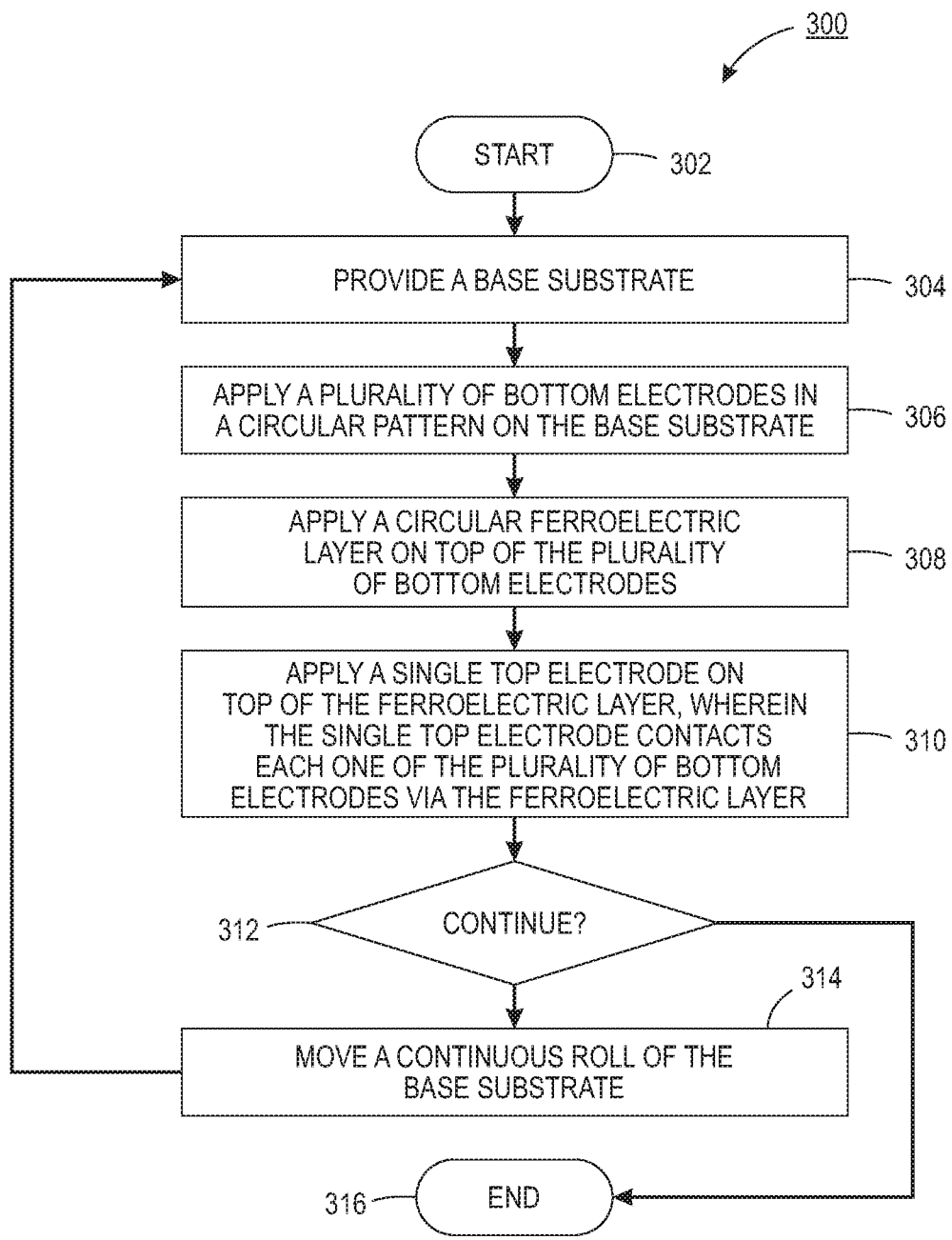
FIG. 3 illustrates a flowchart of an example method for fabricating a circular printed memory device.
Figure 4:
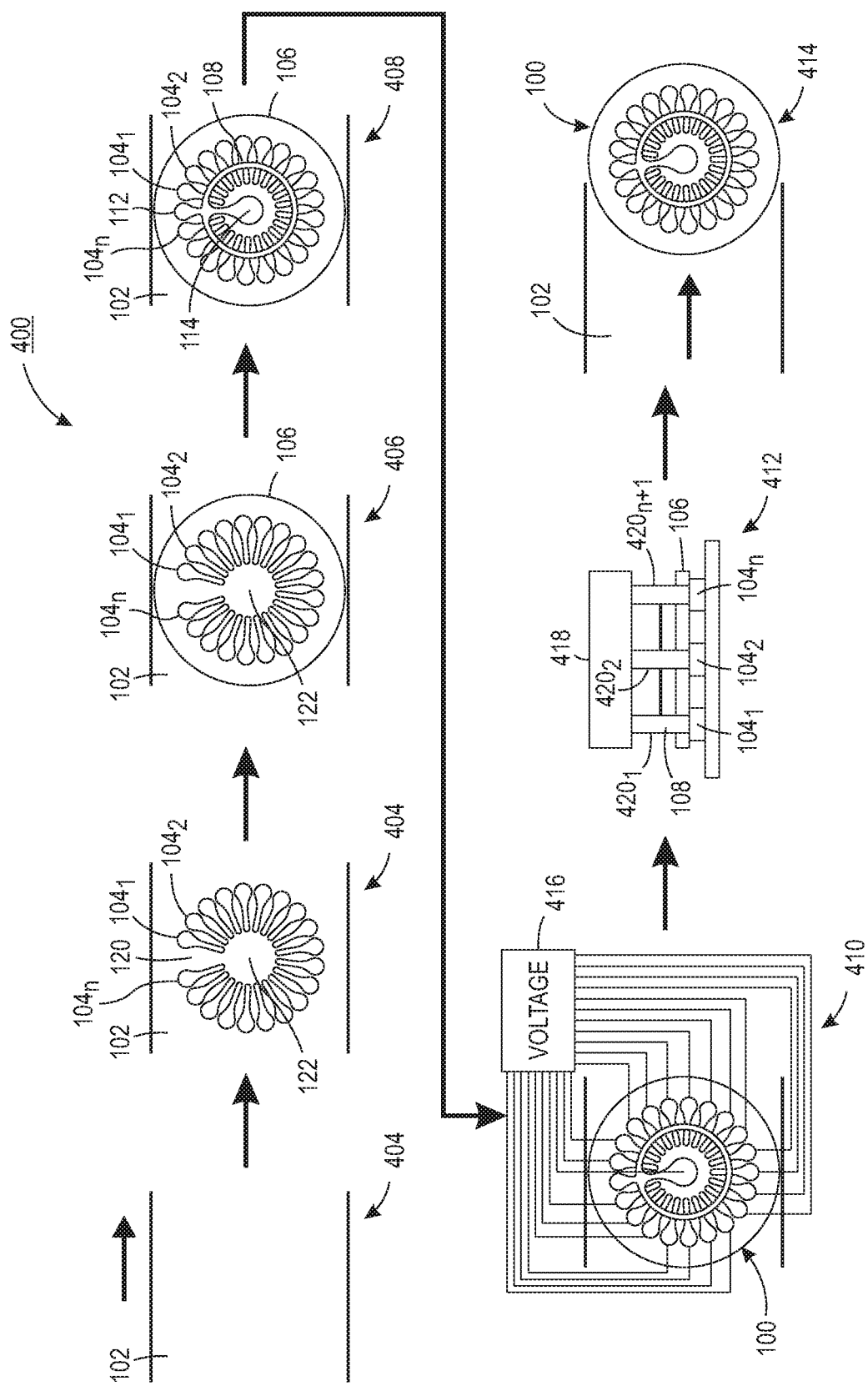
FIG. 4 illustrates a process flow diagram of an example method for fabricating a circular printed memory device.
Figure 5:
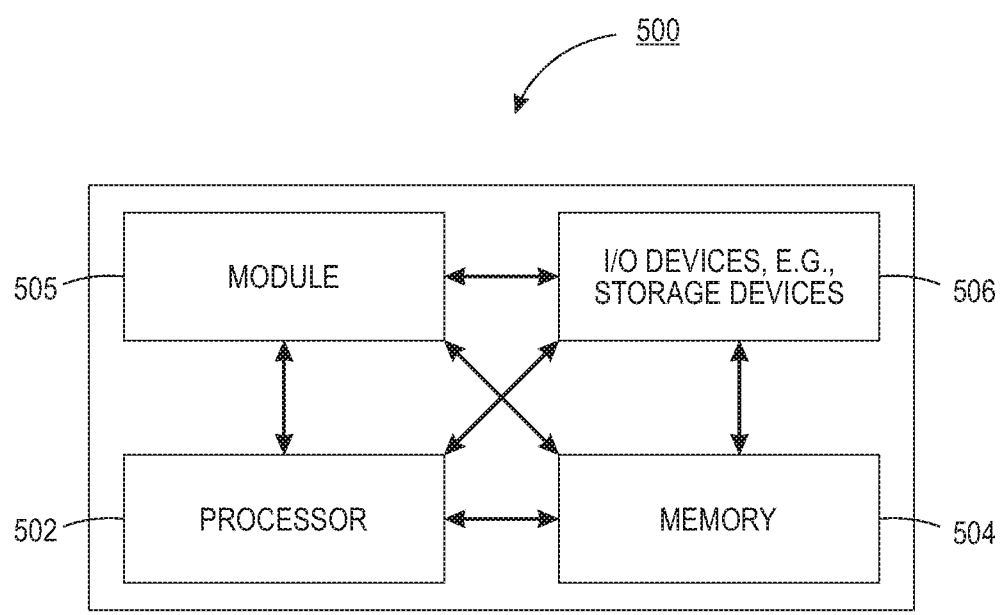
FIG. 5 illustrates a high-level block diagram of a computer suitable for use in performing the functions described herein.

FIG. 3 illustrates a flowchart of an example method 300 for fabricating a circular printed memory device. In one embodiment, one or more steps or operations of the method 300 may be performed by a controller or a computer as illustrated in FIG. 5, and discussed below, that controls a series of automated tools or machines in a manufacturing plant that perform the method 300. FIG. 4 illustrates a process flow diagram 400 of the method for fabricating the circular printed memory device. FIG. 4 may be read in conjunction with the blocks of FIG. 3.

At block 302, the method 300 begins. At block 304, the method 300 provides a base substrate. As shown in block 402 of the process flow diagram 400, the base substrate 102 may be provided as a continuous sheet from a roll of the base substrate 102 that can be fed in an assembly line. The continuous sheet of the base substrate 102 may be fed from left to right, or right to left. The example in FIG. 4 illustrates the feed of the base substrate 102 moving from left to right.

At block 306, the method 300 applies a plurality of bottom electrodes in a circular pattern on the base substrate. The electrodes may be pre-fabricated or printed by another machine or process within the assembly line. A machine may then place the bottom electrodes in the circular pattern on the base substrate.

For example, block 404 of FIG. 4 illustrates the circular pattern. The circular pattern may include a center opening 122 and a single open position 120. It should be noted that the number of bottom electrodes illustrated in FIG. 4 should note be considered limiting. In addition, the size of the bottom electrodes, the size of the single open position 120 and the size of the center opening 122 are not drawn to scale.

In one embodiment, the base substrate 102 may be stationary for each one of the blocks 404-412. For example, a single machine may perform each block 404-412. In another embodiment, the base substrate 102 may be moved for each block 404-412. In other words, a different machine may perform each respective block 404-412.

At block 308, the method 300 applies a ferroelectric layer on top of the plurality of bottom electrodes. For example, the ferroelectric layer may be placed over all of the bottom electrodes 104 as shown in block 406 of FIG. 4.

At block 310, the method 300 applies a single top electrode on top of the ferroelectric layer, wherein the single top electrode contacts each one of the plurality of bottom electrodes via the ferroelectric layer. As shown in block 408 of FIG. 4, the single top electrode 108 may be positioned such that the center member 114 is located in a center of the center opening 122 (shown in block 404). In addition, the perimeter member 112 is located in the single open position 120 (shown in block 404). In addition, the ring 108 may contact extended member 118 of each one of the bottom electrodes 104 via the ferroelectric layer.

Additional optional components may be added at block 310. For example, an additional conductive contact layer may be added to each circular contact area of the bottom electrodes and the perimeter member 112 and the center member 114.

After the circular printed memory device 100 is completed, the circular printed memory device 100 may be initialized and tested. As shown in block 410 of FIG. 4, the printed memory device 100 may be connected to a voltage source 416. Voltage may be applied across the ferroelectric layer 106 in each cell spatially defined by the plurality of bottom electrodes 104 to polarize the ferroelectric layer 106 and store a desired bit value (e.g., 0 or 1).

At block 412 of FIG. 4, the circular printed memory device 100 may be tested via write/read patterns performed by a reading device 418. Pins $420_1$- to $420_{n+1}$ (herein after also referred to individually as a pin 420 or collectively as pins 420) may contact respective bottom electrodes $104_1$ to $104_n$ and the perimeter member 112. Block 412 illustrates a cross-sectional view of the contact between the pins 420 and the bottom electrodes 104. As noted above, a pin 420 that contacts the perimeter member 112 and the center member 114 may detect low impedance (e.g., due to the approximately zero resistance), or an approximately zero resistance, on the perimeter member 112. The reading device 418 may identify the perimeter member 112 as pin 0 based on the low impedance and then identify each subsequent bottom electrode 104 sequentially in a clockwise or counterclockwise fashion.

Referring back to FIG. 3, at block 312 the method 300 determines if the method 300 should continue. For example, the method 300 may be performed by an assembly line that provides a continuous sheet of the base substrate. For example, a roll or large sheet of the base substrate may be fed through the assembly line to form a plurality of circular printed memory devices. Each circular printed memory device may be cut or stamped out of the continuous sheet of the base substrate. If the method 300 determines that the method 300 should continue (e.g., more of the base substrate is available in the roll or large sheet that is fed to the assembly line), then the method may return to block 304. As illustrated by block 414 in FIG. 4, the sheet may be fed and the completed circular printed memory device 100 may be moved to provide a new base substrate. Blocks 304-312 of FIG. 3 and 404-412 of FIG. 4 may then be repeated.

However, if the answer to block 312 is no, then the method 300 may proceed to block 316. At block 316, the method 300 ends.

It should be noted that although not explicitly specified, one or more steps, functions, or operations of the methods 300 and 400 described above may include a storing, displaying and/or outputting step as required for a particular application. In other words, any data, records, fields, and/or intermediate results discussed in the methods can be stored, displayed, and/or outputted to another device as required for a particular application. Furthermore, steps, blocks or operations in FIGS. 3 and 4 that recite a determining operation or involve a decision do not necessarily require that both branches of the determining operation be practiced. In other words, one of the branches of the determining operation can be deemed as an optional step. In addition, one or more steps, blocks, functions or operations of the above described methods 300 and 400 may comprise optional steps, or can be combined, separated, and/or performed in a different order from that described above, without departing from the example embodiments of the present disclosure. Furthermore, the use of the term "optional" in the above disclosure does not mean that any other steps not labeled as "optional" are not optional. As such, any claims not reciting a step that is not labeled as optional is not to be deemed as missing an essential step, but instead should be deemed as reciting an embodiment where such omitted steps are deemed to be optional in that embodiment.

FIG. 5 depicts a high-level block diagram of a computer that is dedicated to perform the functions described herein. As depicted in FIG. 5, the computer 500 comprises one or more hardware processor elements 502 (e.g., a central processing unit (CPU), a microprocessor, or a multi-core processor), a memory 504, e.g., random access memory (RAM) and/or read only memory (ROM), a module 505 for fabricating a circular printed memory device, and various input/output devices 506 (e.g., storage devices, including but not limited to, a tape drive, a floppy drive, a hard disk drive or a compact disk drive, a receiver, a transmitter, a speaker, a display, a speech synthesizer, an output port, an input port and a user input device (such as a keyboard, a keypad, a mouse, a microphone and the like)). Although only one processor element is shown, it should be noted that the computer may employ a plurality of processor elements. Furthermore, although only one computer is shown in the figure, if the method(s) as discussed above is implemented in a distributed or parallel manner for a particular illustrative example, i.e., the steps of the above method(s) or the entire method(s) are implemented across multiple or parallel computers, then the computer of this figure is intended to represent each of those multiple computers. Furthermore, one or more hardware processors can be utilized in supporting a virtualized or shared computing environment. The virtualized computing environment may support one or more virtual machines representing computers, servers, or other computing devices. In such virtualized virtual machines, hardware components such as hardware processors and computer-readable storage devices may be virtualized or logically represented.

It should be noted that the present disclosure can be implemented in software and/or in a combination of software and hardware, e.g., using application specific integrated circuits (ASIC), a programmable logic array (PLA), including a field-programmable gate array (FPGA), or a state machine deployed on a hardware device, a computer or any other hardware equivalents, e.g., computer readable instructions pertaining to the method(s) discussed above can be used to configure a hardware processor to perform the steps, functions and/or operations of the above disclosed methods. In one embodiment, instructions and data for the present module or process 505 for fabricating a circular printed memory device (e.g., a software program comprising computer-executable instructions) can be loaded into memory 504 and executed by hardware processor element 502 to implement the steps, functions or operations as discussed above in connection with the example methods 300 and 400. Furthermore, when a hardware processor executes instructions to perform "operations," this could include the hardware processor performing the operations directly and/or facilitating, directing, or cooperating with another hardware device or component (e.g., a co-processor and the like) to perform the operations.

The processor executing the computer readable or software instructions relating to the above described method(s) can be perceived as a programmed processor or a specialized processor. As such, the present module 505 for fabricating a circular printed memory device (including associated data structures) of the present disclosure can be stored on a tangible or physical (broadly non-transitory) computer-readable storage device or medium, e.g., volatile memory, non-volatile memory, ROM memory, RAM memory, magnetic or optical drive, device or diskette and the like. More specifically, the computer-readable storage device may comprise any physical devices that provide the ability to store information such as data and/or instructions to be accessed by a processor or a computing device such as a computer or an application server.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

What is claimed is:

1. A method for fabricating a circular printed memory device, comprising:
   providing a base substrate;
   applying a plurality of bottom electrodes in a circular pattern on the base substrate;
   applying a circular ferroelectric layer on top of the plurality of bottom electrodes; and
   applying a single top electrode on top of the ferroelectric layer, wherein the ferroelectric layer contacts each one of the plurality of bottom electrodes and the single top electrode.

2. The method of claim 1, comprising:
   applying an additional conductive contact layer on a contact area of each one of the plurality of bottom electrode.

3. The method of claim 2, wherein a memory cell is formed by each one of the plurality of bottom electrodes intersecting the single top electrode and the ferroelectric layer.

4. The method of claim 3, comprising:
   storing a single bit in the memory cell.

5. The method of claim 1, comprising:
   initializing the circular printed memory device.

6. The method of claim 5, comprising:
   testing write/read patterns of the circular printed memory device via a reading device, wherein a perimeter member of the single top electrode has an approximately zero resistance and is identified as pin 0 by the reading device.

7. The method of claim 6, comprising:
  identifying each subsequent bottom electrode of the plurality of bottom electrodes in a clockwise or counterclockwise fashion after the pin 0 is identified.

8. The method of claim 1, wherein the base substrate comprises a continuous roll and the method is repeated to fabricate a plurality of circular printed memory devices.

9. The method of claim 1, wherein the circular pattern comprises a single open position between two of the plurality of bottom electrodes and a center open position at a center of the circular pattern.

10. The method of claim 9, wherein the single top electrode comprises a ring comprising a center member and a perimeter member.

11. The method of claim 10, wherein the perimeter member is located on top of the ferroelectric layer in the single open position.

12. The method of claim 10, wherein the perimeter member and each one of the plurality of bottom electrodes comprise an approximately circular contact pad.

13. The method of claim 10, wherein the center member is located on top of the ferroelectric layer in the center member.

14. The method of claim 1, wherein a number of the plurality of bottom electrodes is a function of a number of bits to be stored in the circular printed memory device.

* * * * *